United States Patent
Strickler

(10) Patent No.: US 6,563,706 B1
(45) Date of Patent: May 13, 2003

(54) TYPICALLY HIGH-AVAILABILITY INFORMATION STORAGE PRODUCT

(75) Inventor: Mike T. Strickler, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/103,665

(22) Filed: Jun. 23, 1998

(51) Int. Cl.⁷ .................................................. H05K 7/20
(52) U.S. Cl. ....................... 361/695; 361/694; 361/688; 361/690; 363/141; 174/16.1; 165/122
(58) Field of Search ................................. 361/687–695, 361/715, 716, 719–721; 174/15.1, 16.1, 16.3; 165/80.2, 80.3, 104.33; 454/184

(56) References Cited

U.S. PATENT DOCUMENTS

| | | | | |
|---|---|---|---|---|
| 4,084,250 A | * | 4/1978 | Albertine et al. ............ | 361/686 |
| 4,899,254 A | * | 2/1990 | Ferchau et al. ............. | 361/685 |
| 5,619,486 A | * | 4/1997 | Uno et al. ................... | 360/137 |
| 5,673,029 A | * | 9/1997 | Behl et al. .................. | 340/584 |
| 5,808,867 A | * | 9/1998 | Wang .......................... | 361/683 |
| 5,808,876 A | * | 9/1998 | Mullenbach et al. ........ | 361/601 |
| 5,822,184 A | * | 10/1998 | Rabinovitz .................. | 361/683 |
| 6,046,921 A | * | 4/2000 | Tracewell et al. .......... | 361/687 |

* cited by examiner

Primary Examiner—Boris Chervinsky

(57) ABSTRACT

A power supply module supplies power to a power bus. The module includes a module casing. Within the module casing is a power supply and a means for cooling the power supply. The power bus supplies power to the means for cooling the module as well as to other devices connected to the power bus. Multiple power supply modules are included in a disk drive array system. Each module provides power to the power bus and to each means for cooling. Upon failure of one of the power supplies, the other of the power supplies will provide power to each device connected to the power bus, including the means for cooling the failed power supply.

15 Claims, 2 Drawing Sheets

TYPICALLY HIGH-AVAILABILITY INFORMATION STORAGE PRODUCT

FIELD OF THE INVENTION

This invention relates in general to an information storage product and, more particularly, to a disk drive power supply module with an internal cooling system having redundant power for cooling.

BACKGROUND OF THE INVENTION

Rack mounted disk drive array systems are utilized by the computer industry for information storage. These systems contain disk drives and power supplies and utilize cooling fans to cool both the disk drives and the power supplies. Cooling the drives and power supplies increases the life of both drives and power supplies thereby improving system reliability.

Conventional typical high availability information storage products such as RAID disk drive arrays include the required number of hot-swap power supply modules plus one redundant hot-swap power supply module. Likewise, the arrays include the required number of hot-swap cooling fan modules plus one redundant hot-swap cooling fan module. In this configuration, if one power supply module fails the remaining power supply module(s) supply sufficient power to the disk drives and fan modules. In a similar manner, one fan module can fail and the remaining fan modules sufficiently cool the disk drives and power supplies.

A typical configuration for these disk drive arrays is the use of separate air cooling paths for the power supplies and disk drives. A first set of fan modules cools the disk drives and various data bus related PC boards using ambient air. A second set of fans within the power supply modules provides an independent air path also drawing from ambient air. This configuration requires a large enclosure to provide ambient air to both sets of fans.

Disk drives designers and manufacturers are under pressure to increase disk drive performance. As disk drive performance increases, the drives enerate more heat requiring better cooling. At the same time, enclosure designers and manufacturers are under pressure to increase disk drive and power supply densities within the enclosures. This results in an increase in rack thermal density.

One method for increasing the enclosure density is to combine disk drive cooling with power supply cooling. Ambient air first cools the disk drives. The heated air then moves on to cool the power supplies.

One enclosure design includes power supply modules with no internal fans. Instead, fans are provided behind the power supplies. The ambient inlet air flows through the disk drives, across the power supplies, and then through the fans which cover a major portion of the rear of the enclosure. This has the disadvantage of requiring the fan modules to be removed to replace a power supply module. Removing the fans causes reduced air flow to the disk drives and the power supplies while the fan module is removed. The result is undesirable higher temperature and thermal cycling within the enclosure.

Another enclosure design includes internal fans within the power supply modules. These enclosures can also utilize additional separate fan modules. Both the power supply modules and fan modules are at the back of the enclosure and the power supply modules are accessible for replacement without significantly reducing air flow. However, the drawback of this configuration is that the internal fans of the power supply are conventionally connected to the power supply within the power supply module. A power supply failure therefore causes these internal fans to stop, reducing disk drive cooling.

SUMMARY OF THE INVENTION

According to principles of the present invention, a power supply module supplies power to a power bus. The module includes a module casing. The power bus is outside the module casing. Within the module casing is a power supply and a means for cooling the power supply. The power bus supplies power to the means for cooling the module as well as to other devices connected to the power bus.

According to further principles of the present invention in a preferred embodiment, multiple power supply modules are included in a disk drive array system. Each module provides power to the power bus and to each means for cooling. Upon failure of one of the power supplies, the other power supplies will provide power to each device connected to the power bus, including the means for cooling the failed power supply.

Other objects, advantages, and capabilities of the present invention will become more apparent as the description proceeds.

DETAILED DESCRIPTION OF THE INVENTION

Figure 1:
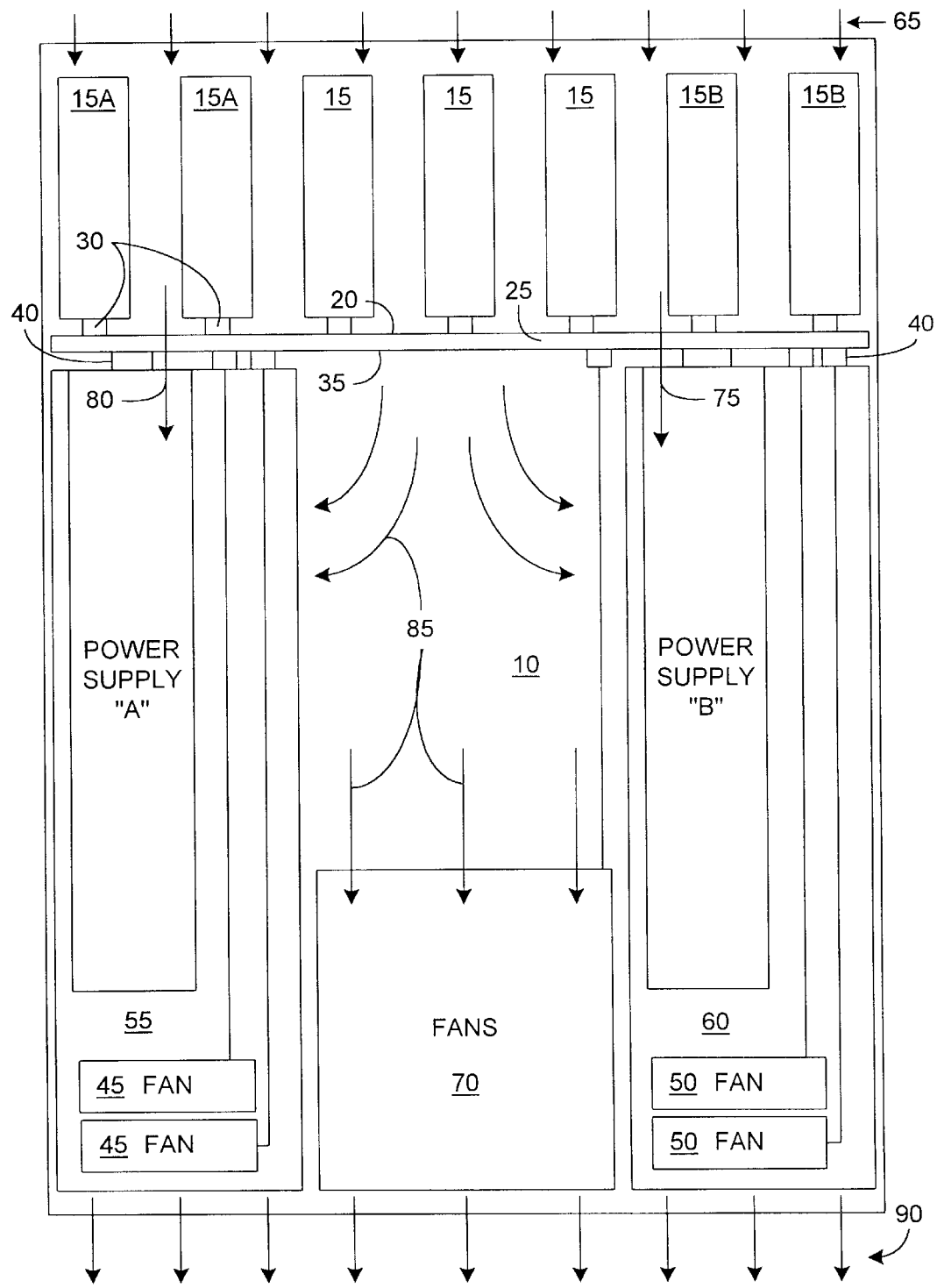
FIG. 1 is a top view showing a power supply module of the present invention in a disk drive array enclosure.

FIG. 1 is a top view of a rack mountable disk drive array enclosure 10. Within enclosure 10 are multiple disk drives 15. Each disk drive 15 connects to a plug connector on front side 20 of a mid-plane board 25 by means of multiple plug connectors 30. On the back side 35 of mid-plane board 25 are additional plug connectors 40 into which are plugged power supplies "A" and "B" and fan connectors. Power supplies "A" and "B" provide power to a power bus on midplane board 25. Only two power supply modules are discussed. However, any number of power supply modules may be used in the present invention. Preferably one of the power supply modules is redundant. The fan connectors carry power to a first pair of fans 45 and a second pair of fans 50. Typically only one fan of each pair is needed to provide adequate cooling. The second fan of the pair is redundant. The fans 45, 50 and power supplies A and B are contained within a pair of redundant load-sharing, hot-swappable power supply/fan modules 55 and 60.

In normal operation, when all fans are running, ambient air flows into enclosure 10 as shown by arrows 65. The ambient air flows over the multiple disk drives 15. The preheated air then flows into module "A" 55, module "B" 60, and into fan module 70 as shown by arrows 75, 80 and 85. The air is drawn though power supplies "A" and "B" by fans 45, and 50 and exhausted from the enclosure 10 at arrows 90.

Figure 2:
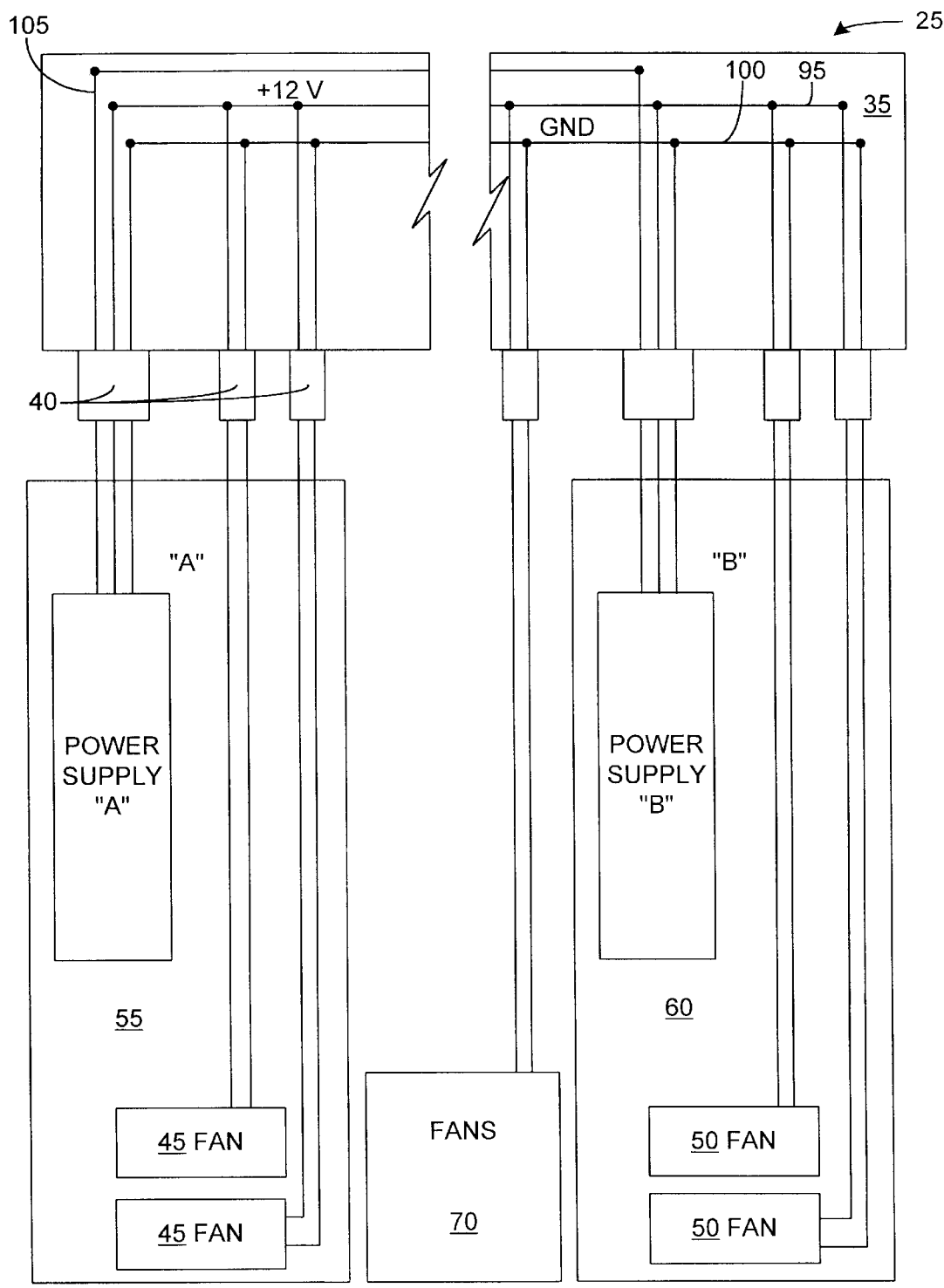
FIG.2 is an electrical schematic of the disk drive array enclosure of FIG. 1.

Referring to FIG. 2, the electrical connections between fans 45, 50, and 70 and power supplies A and B are shown connecting to the back 35 of mid-plane board 25. The mid-plane board 25 includes 12 volt bus 95, ground bus 100, and load sharing connection 105.

The 12 volt bus 95 and ground bus 100 together constitute a power bus for supplying power to all devices attached to the power bus. Attached devices include fan and disk drives. Load sharing connection 105 provides communication between power supply modules "A" and "B" to allow an even load sharing between the modules "A" and "B". More importantly, when either module "A" or module "B" fails, the failing module "A", "B" signals the non-failing module "A", "B" using load sharing connection 105. The non-failing module "A", "B" then assumes the portion of the load on the power bus which the failing module had supported.

Electrical connections between the back 35 of mid-plane board 25 and the modules 55, 60, and 70 are made through plug-in connectors 40. These plugs permit hot-swapping (exchange while in operation) of modules in the case of a failure of power supply A or B.

In operation it can be seen that in case of failure of either A or B power supply, either of the fan pairs 45 or 50 will continue to run since they are all powered by 12 volt bus 95. This maintains normal balanced air flow over disk drives 15, and particularly drives 15A and 15B, thereby avoiding thermal cycling which leads to reduced drive life.

What is claimed is:

1. A power supply module for supplying power to a power bus, the power supply module comprising:
   (a) a module casing;
   (b) a power supply positioned within the module casing;
   (c) cooling means positioned within the module casing for providing cooling;
   (d) means for conducting power from the power supply to the power bus; and,
   (e) means for drawing power from the power bus for supplying the cooling means.

2. The power supply module of claim 1 wherein the cooling means includes at least one fan.

3. The power supply module of claim 2 wherein the cooling means further includes at least one redundant fan.

4. The power supply module of claim 1 wherein the means for conducting power includes conductors having first and second ends, the first ends of the conductors connected to the power supply, the second ends of the conductors connected to the power bus, wherein the conductors pass through the module casing.

5. The power supply module of claim 1 wherein the means for drawing power includes conductors having first and second ends, the first ends of the conductors connected to the power supply, the second ends of the conductors connected to the power bus, wherein the conductors pass through the module casing.

6. A power supply system comprising:
   (a) a power bus; and,
   (b) a plurality of power supply modules, each power supply module including:
      (i) a module casing;
      (ii) a power supply positioned within the module casing;
      (iii) cooling means positioned within the module casing for providing cooling;
      (iv) means for conducting power from the power supply to the power bus; and,
      (v) means for drawing power from the power bus for supplying the cooling means.

7. The power supply module of claim 6 wherein the cooling means includes at least one fan.

8. The power supply module of claim 7 wherein the cooling means further includes at least one redundant fan.

9. The power supply module of claim 6 wherein the means for conducting power includes conductors having first and second ends, the first ends of the conductors connected to the power supply, the second ends of the conductors connected to the power bus, wherein the conductors pass through the module casing.

10. The power supply module of claim 6 wherein the means for drawing power includes conductors having first and second ends, the first ends of the conductors connected to the power supply, the second ends of the conductors connected to the power bus, wherein the conductors pass through the module casing.

11. A disk drive array system comprising:
    (a) a power bus; and
    (b) at least one disk drive connected to the power bus for drawing power from the power bus;
    (c) at least two power supply modules each power supply module connected to the power bus for supplying power to the power bus, each power supply module having a means for cooling the disk drive array system, wherein each means for cooling is connected to the power bus for drawing power from the power bus.

12. The disk drive array system of claim 11 further including a fan module for cooling the disk drive array system, the fan module connected to the power bus for drawing power from the power bus.

13. The disk drive array system of claim 11 wherein each means for cooling the disk drive array system includes at least one fan positioned within each power supply module.

14. The disk drive array system of claim 13 wherein the means for cooling each power supply module further includes at least one redundant fan positioned within each power supply module.

15. The disk drive array system of claim 11 further including at least one redundant power supply module.

* * * * *